(12) United States Patent
Ozawa et al.

(10) Patent No.: US 7,276,968 B2
(45) Date of Patent: Oct. 2, 2007

(54) CLASS D AMPLIFIER

(75) Inventors: Akio Ozawa, Saitama-ken (JP); Kazuyuki Kudo, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 175 days.

(21) Appl. No.: 11/195,832

(22) Filed: Aug. 3, 2005

(65) Prior Publication Data

US 2006/0028272 A1    Feb. 9, 2006

(30) Foreign Application Priority Data

Aug. 3, 2004    (JP) .............................. 2004-226928

(51) Int. Cl.
*H03F 3/217*    (2006.01)
*H03F 3/52*    (2006.01)
(52) U.S. Cl. ...................... 330/251; 330/298
(58) Field of Classification Search ............ 330/207 A, 330/207 P, 251, 298
See application file for complete search history.

(56) References Cited

U.S. PATENT DOCUMENTS 6,108,182 A  *  8/2000  Pullen ......................... 361/89
6,448,851 B1  *  9/2002  McIntosh et al. ........ 330/207 A
6,476,673 B2  * 11/2002  Takagishi .................... 330/10
6,597,240 B1  *  7/2003  Walburger et al. ............ 330/10

* cited by examiner

*Primary Examiner*—Steven J. Mottola
(74) *Attorney, Agent, or Firm*—Arent Fox LLP

(57) ABSTRACT

A drive signal that matches the bias of a transistor is generated. A differential amplifier calculates the difference between a specified voltage of negative power supply and another input signal. Then, a resistor that realizes a pull-down function level-shifts it towards a negative power supply voltage having a higher absolute voltage value to generate another differential signal, which is in turn amplified in another amplifier, to generate another drive signal that matches the bias of another transistor. Respective current mirror circuits detect a falling voltage occurring at both ends of a resistor connected between the transistor and the higher positive power supply voltage and a falling voltage occurring at both ends of a resistor connected between the other transistor and the higher negative power supply voltage, respectively. Then, the presence of an excessive electric current is detected by generating electric currents in accordance with to the falling voltages.

3 Claims, 5 Drawing Sheets

CLASS D AMPLIFIER

BACKGROUND OF THE INVENTION

The present invention relates to a class D amplifier that amplifies square-wave signals which have undergone, for example, pulse width modulation (PWM) or pulse density modulation (PDM).

The present application claims priority from Japanese Application No. 2004-226928, the disclosure of which is incorporated herein by reference.

In recent years, simpler, smaller, and higher efficiency system configurations of audio systems performing digital signal processing have been strived for through the use of class D amplifiers. In these systems, the class D amplifiers amplify square-wave audio signals (so-called, 1-bit stream format audio signals) formed by pulse width modulation or pulse density modulation and directly supply them to speakers via a low-pass filter.

FIG. 1 is a schematic diagram that represents the configuration of a conventional class D amplifier applied to this type of digital audio system.

The class D amplifier in this figure is connected to a semiconductor integrated circuit device (IC) 1. Here, the IC 1 is equipped with a modulator 2 that converts analog input signals and PCM digital signals to 1-bit stream format signals Pin using pulse width modulation or pulse density modulation.

In other words, the semiconductor integrated circuit device 1 operates using two power supply voltages of positive power supply voltage +VL and negative power supply voltage −VL which are equal absolute potential relative to the ground potential (0 V) as a reference. In addition to the modulator 2, the device 1 includes waveform detectors 3a, 3b, excessive electric current detectors 4a, 4b, and amplifiers 5a, 5b. The amplifiers 5a and 5b amplify 1-bit stream format signals Pin and then output 1-bit stream format signals Pa and Pb (hereinafter, simply referred to as output modulated signals) respectively, to allow a P-channel field-effect transistor FETa and an N-channel field effect transistor FETb (described later) to operate in a push-pull manner.

The class D amplifier operates using two power supply voltages of positive power supply voltage +VH and negative power supply voltage −VH which are higher than power supply voltages +VL and −VL respectively, and are equal absolute potential relative to the ground potential as a reference. The class D amplifier comprises a power amplification zone formed from the P-channel field effect transistor FETa and the N-channel field effect transistor FETb, resistors 6a, 6b, RLa, and RLb, and Zener diodes 7a, 7b, 8a, 8b, 9a, and 9b.

The Zener diodes 9a and 9b which generate equal Zener voltages each form a power supply voltage shifter. These shifters supply the respective power supply voltages +VL and −VL to the semiconductor integrated circuit device 1. The power supply voltages +VL and −VL have been lowered by respective Zener voltages so as to be lower than the positive power supply voltage +VH and the negative power supply voltage −VH supplied from a main power supply (not shown in the figure).

The transistors FETa and FETb are connected through respective resistors RLa and RLb between power supply terminals for the power supply voltages +VH and −VH. The push-pull operation of the transistors FETa and FETb, which follows drive signals Pga and Pgb, outputs a power-amplified, 1-bit stream format signal (hereinafter referred to as "an output modulated signal") Pout. Thereafter, supplying this output modulated signal Pout to a low-pass filter composed of a coil 10 and a capacitor 11 converts the signal to analog audio signal Sout which is then output to a speaker, for example.

The resistors 6a and 6b are determined to be equal resistance values and the Zener diodes 7a and 7b are formed by Zener diodes which generate equal Zener voltages.

The resistor 6a and the Zener diode 7a, which form a bias voltage level shifter, apply a level shift (voltage bias) to the input modulated signal Pa based on the Zener voltage and that level-shifted drive signal Pga is supplied to the gate of the transistor FETa.

In other words, the Zener diode 7a generates the drive signal Pga, that varies within a voltage range between the ground potential and the power supply voltage +VH as shown in FIG. 2(b), by applying a positive voltage bias to the input modulated signal Pa, that varies within a voltage range between the ground potential (0 V) and the power supply voltage +VL as shown in FIG. 2(a), to adjust it to the bias condition of the transistor FETa that operates under the power supply voltage +VH.

In a similar manner, the resistor 6b and the Zener diode 7b, which form a bias voltage level shifter, apply a level shift (voltage bias) to the input modulated signal Pb based on the Zener voltage and that level-shifted drive signal Pgb is supplied to the gate of the transistor FETb.

In other words, the Zener diode 7b generates the drive signal Pgb, that varies within a voltage range between the ground potential and the power supply voltage −VH as shown in FIG. 2(b), by applying a negative voltage bias to the input modulated signal Pb that varies within a voltage range between the ground potential (0 V) and the power supply voltage −VL as shown in FIG. 2(a), to adjust it to the bias condition of the transistor FETb that operates under the power supply voltage −VH.

A connection point between the resistor 6a and the Zener diode 7a is connected to the input terminal of the waveform detector 3a. An analysis of whether or not waveform distortions are occurring in the drive signal Pga is automatically performed by supplying an output waveform of the resistor 6a to the waveform detector 3a.

Furthermore, a connection point between the resistor 6b and the Zener diode 7b is connected to the input terminal of the waveform detector 3b. An analysis of whether or not waveform distortions are occurring in the drive signal Pgb is automatically performed by supplying an output waveform of the resistor 6b to the waveform detector 3b.

The Zener diode 8a connected between the resistor RLa and the input terminal of the excessive electric current detector 4a, and the Zener diode 8b connected between the resistor RLb and the input terminal of the excessive electric current detector 4b, are provided to detect excessive electric current flowing in the transistors FETa and FETb through the resistors RLa and RLb, respectively.

In other words, the Zener diode 8a forms an excess electric current detection level shifter. This level shifter level-shifts a voltage VRLab (lowered by the falling voltage VRLa occurring at both ends of the resistor RLa with reference to the power supply voltage +VH as shown in FIG. 2(c)) based on the corresponding Zener voltage and supplies it to the excessive electric current detector 4a. Then, as shown in FIG. 2(d), the Zener diode 8a supplies a falling voltage VRLac adjusted to the bias condition of the excessive electric current detector 4a operating under the power supply voltage +VL.

If the falling voltage VRLac becomes larger than a predetermined allowable voltage, the excessive electric current detector 4a detects the occurrence of an excessive electric current and takes necessary steps to stop input modulated signals Pa and Pb in order to prevent a damage to the transistor FETa.

In addition, in a like manner, the Zener diode 8b forms an excess electric current detection level shifter. This level shifter level-shifts a voltage VRLbb (lowered by the falling voltage VRLb occurring at both ends of the resistor RLb with reference to the power supply voltage −VH as shown in FIG. 2(c)) based on the corresponding Zener voltage and supplies it to the excessive electric current detector 4b. Then, as shown in FIG. 2(d), the Zener diode 8b supplies a falling voltage VRLbc adjusted to the bias condition of the excessive electric current detector 4b operating under the power supply voltage −VL.

If the falling voltage VRLbc becomes larger than a predetermined allowable voltage, the excessive electric current detector 4b detects the occurrence of an excessive electric current and takes necessary steps to stop input modulated signals Pa and Pb in order to prevent a damage to the transistor FETb.

As described above, a conventional class D amplifier performs highly efficient power amplification by operating transistors FETa and FETb under high voltage power supply voltages +VL and −VL. Various types of level shifters are also provided which utilize Zener diodes 7a, 7b, 8a, and 8b, so as to perform power amplification in accordance with the respective bias conditions of the semiconductor integrated circuit device 1 that operates under power supply voltages +VL and −VL, and the class D amplifier that operates under power supply voltages +VH and −VH.

Zener diodes 7a, 7b, 8a, and 8b are provided in order for conventional class D amplifiers to perform predetermined operations in accordance with the bias conditions of the semiconductor integrated circuit device 1 and the class D amplifier as described above. In addition, Zener diodes 9a and 9b are provided in order to make different the power supply voltages +VL, −VL for the semiconductor integrated circuit device 1 and the power supply voltages +VH, −VH for the class D amplifier.

Since these Zener diodes 7a, 7b, 8a, 8b, 9a, 9b do not always generate equal Zener voltages for each set due to their electrical and other properties, there were problems of variations in the Zener voltages (manufacturing variations, fluctuations during operation, and the like), hence making it impossible for the class D amplifiers to perform the predetermined operations that are adjusted to the bias conditions described above.

In other words, if variations occur in the Zener voltage between the Zener diode 7a that forms the bias voltage level shifter of the power supply voltage +VH side in FIG. 1 and the Zener diode 7b that forms the bias voltage level shifter of the power supply voltage −VH side in FIG. 1, the bias points of the drive signals Pga and Pgb respectively supplied to the transistors FETa and FETb which operate in a push-pull manner, will shift away from the correct bias as illustrated in FIG. 2(b), causing problems such as waveform distortions in the output modulated signal Pout and the inability to perform efficient power amplification. As a result of the bias points of the drive signals Pga, Pgb shifting away from the correct bias, a load that exceeds the allowable power loss is applied to at least one of the transistors FETa and FETb, which leads to a problem of the transistors being easily damaged.

Even further, even if the Zener voltages of both the Zener diodes 7a and 7b are shifted from the correct Zener voltage, problems will occur such as waveform distortions in the output modulated signal Pout, inability to perform efficient power amplification, and damage to transistors FETa, FETb.

If variations occur in the Zener voltage of the Zener diode 8a that forms the excessive electric current detection level shifter of the positive power supply voltage +VH side, an offset voltage will be applied to the falling voltage VRLac as illustrated in FIG. 2(d) generating a voltage fluctuation and consequently causing a problem of the excessive electric current detector 4a not being able to correctly detect the excessive electric current flowing in the transistor FETa.

If variations occur in the Zener voltage of the Zener diode 8b that forms the excessive electric current detection level shifter of the positive power supply voltage −VH side, an offset voltage will be applied to the falling voltage VRLbc as illustrated in FIG. 2(d), generating a voltage fluctuation and consequently causing a problem of the excessive electric current detector 4b not being able to correctly detect the excessive electric current flowing in the transistor FETb.

When variations in the Zener voltage occur in the Zener diodes 9a and 9b each forming a power supply voltage shifter, a problem occurs in which it becomes impossible to operate the semiconductor integrated circuit device 1 based on the correct voltage of two power supply voltages +VL and −VL.

SUMMARY OF THE INVENTION

In view of the foregoing conventional problems, an object of the present invention is to provide a class D amplifier having bias voltage level shift means that can suitably level-shift the bias of drive signals to be supplied to switching elements that form a power amplification zone and operate in a push-pull manner.

Another object of the present invention is to provide a class D amplifier having excessive electric current detection means that can accurately detect excessive electric current flowing in switching elements that form a power amplification zone and operate in a push-pull manner.

According to a first aspect of the present invention, a class D amplifier comprises: a pair of switching elements composed of first and second switching elements which are complementally symmetrical with respect to a voltage of a power supply; first bias voltage level shift means that generates a drive signal to be supplied to the first switching element by level-shifting a square-wave first input signal; and second bias voltage level shift means that generates a drive signal to be supplied to the second switching element by level-shifting a square-wave second input signal. Such class D amplifier is provided for performing class D amplification by allowing the first and second switching elements to perform a push-pull operation based on the respective drive signals supplied thereto. In particular, the first bias voltage level shift means has first differential amplification means that calculates a differential signal between the first input signal and a predetermined voltage, and first bias means that generates a level-shifted drive signal to be supplied to the first switching element by pulling up the differential signal towards the power supply voltage of the first switching element. Further, the second bias voltage level shift means has second differential amplification means that calculates a differential signal between the second input signal and a predetermined voltage, and second bias means that generates a level-shifted drive signal to be supplied to the second switching element by pulling down the differential signal towards the power supply voltage of the second switching element.

According to a second aspect of the present invention, there is provided a class D amplifier having a pair of switching elements composed of first and second switching elements which are complementally symmetrical with respect to a voltage of a power supply, the class D amplifier being provided for performing class D amplification by allowing the first and second switching elements to perform a push-pull operation based on the respective square-wave drive signals supplied thereto. Such class D amplifier comprises: a first resistor connected between the first switching element and the power supply; a second resistor connected between the second switching element and the power supply; a first current mirror circuit that receives a falling voltage generated at both ends of the first resistor and generates an electric current corresponding to the falling voltage; and a second current mirror circuit that receives a falling voltage generated at both ends of the second resistor and generates an electric current corresponding to the falling voltage. In particular, the respective currents output from the first and second current mirror circuits serve as an excessive electric current detection current that shows whether or not excessive electric currents flow in the first and second switching elements.

According to a third aspect of the present invention, a class D amplifier comprises: a pair of switching elements composed of first and second switching elements which are complementally symmetrical with respect to a voltage of a power supply; first bias voltage level shift means that generates a drive signal to be supplied to the first switching element by level-shifting a square-wave first input signal; and second bias voltage level shift means that generates a drive signal to be supplied to the second switching element by level-shifting a square-wave second input signal. Such class D amplifier is provided for performing class D amplification by allowing the first and second switching elements to perform a push-pull operation based on the respective drive signals supplied thereto. In particular, the class D amplifier further comprises: a first resistor connected between the first switching element and the power supply; a second resistor connected between the second switching element and the power supply; a first current mirror circuit that receives a falling voltage generated at both ends of the first resistor and generates an electric current corresponding to the falling voltage; and a second current mirror circuit that receives a falling voltage generated at both ends of the second resistor and generates an electric current corresponding to the falling voltage. Further, the first bias voltage level shift means has first differential amplification means that calculates a differential signal between the first input signal and a predetermined voltage, and first bias means that generates a level-shifted drive signal to be supplied to the first switching element by pulling up the differential signal towards the power supply voltage of the first switching element. Moreover, the second bias voltage level shift means has second differential amplification means that calculates a differential signal between the second input signal and a predetermined voltage, and second bias means that generates a level-shifted drive signal to be supplied to the second switching element by pulling down the differential signal towards the power supply voltage of the second switching element.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 3:
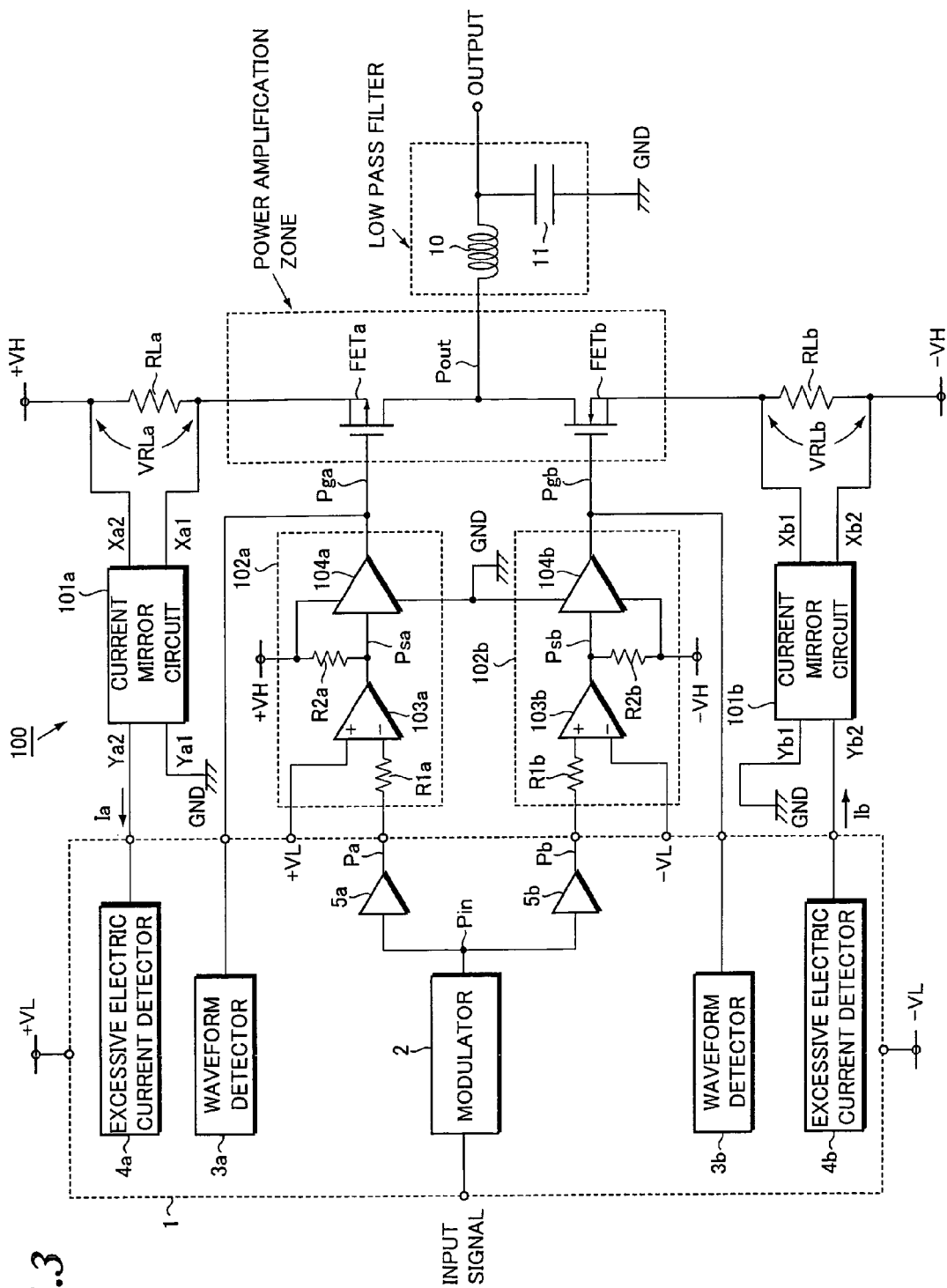
FIG. 3 is a block diagram showing the configuration of a class D amplifier according to one embodiment of the present invention.

In the following, embodiments of the present invention will be described in detail with reference to FIG. 3. FIG. 3 is a block diagram showing the configuration of a class D amplifier according to the present embodiment.

The configuration of the class D amplifier 100 of this embodiment in this figure will first be described. As an example, the class D amplifier 100 amplifies power based on first and second input modulated waves (signals which have undergone PWM or PDM modulation) Pa and Pb (which are 1-bit stream format, output from a semiconductor integrated circuit device 1 as mentioned in the description of the conventional technology) and then outputs the 1-bit stream format modulated signal Pout that has undergone power amplification. Then, the output modulated signal Pout is supplied to a low pass filter composed of a coil 10 and a capacitor to thereby be converted to an analog audio signal Sout. This signal can directly drive devices such as speakers.

The class D amplifier 100 is connected to a detection circuit or a sensing circuit which correspond to waveform detectors 3a, 3b or excessive electric current detectors 4a, 4b provided in the semiconductor integrated circuit device 1 mentioned in the description of the conventional technology.

In other words, although not limited to a semiconductor integrated circuit device 1 mentioned in the description of the conventional technology, the class D amplifier 100 is designed such that it outputs signals to allow a detection circuit or a detecting circuit (which correspond to waveform detectors 3a, 3b and excessive electric current detectors 4a, 4b) to detect waveforms of drive signals Pga and Pgb and also detect the generation of excessive electric current.

Next, the configuration of the class D amplifier 100 will be described.

This class D amplifier 100 can operate at a voltage higher than the two power supply voltages +VL and −VL for the semiconductor integrated circuit device 1 and receives a supply of a positive power supply voltage +VH and a negative power supply voltage −VH both of which are equal to the absolute value of the voltage between positive and negative with reference to the ground potential (0 V). The positive power supply voltage +VH and the negative power supply voltage −VH are supplied from a power supply circuit (not shown in the figure) separate from the two power supply voltages +VL and −VL.

The class D amplifier 100 comprises a pair of switching elements, current mirror circuits 101a and 101b, and bias voltage level shifters 102a and 102b. The pair of switching elements are provided between the respective power supply terminals of the positive power supply voltage +VH and the negative power supply voltage −VH. This pair of switching elements are composed of a P-channel field effect transistor FETa that serves as a first switching element and an N-channel field effect transistor FETb that serves as a second switching element. These first and second switching elements are complementally symmetrical with respect to the power supply voltage. The current mirror circuits 101*a* and 101*b* serve as excessive electric current detection means.

The bias voltage level shifter 102*a* comprises a differential amplifier 103*a*, a resistor R2*a*, and a voltage amplifier 104*a*. The differential amplifier 103*a* receives the input modulated signal Pa supplied through resistor R1*a* from an amplifier 5*a* provided in the semiconductor integrated circuit device 1 and then outputs a differential signal that corresponds to the voltage difference between the input modulated signal Pa and the positive power supply voltage +VL. The resistor R2*a* is connected between the power supply terminal of the positive power supply voltage +VH and the output terminal (output terminal where differential signals are output) of the differential amplifier 103*a*. The voltage amplifier 104*a* performs voltage amplification of a signal Psa generated at the output terminal of the differential amplifier 103*a* and then generates the drive signal Pga to be supplied to the gate of the transistor FETa.

Here, the resistor R2*a* serves as first bias means that realizes a function that connects the power supply terminal of the positive power supply voltage +VH to the output terminal of the differential amplifier 103*a*, thereby pulling up the potential of the output terminal of the differential amplifier 103*a* towards the positive power supply voltage +VH.

Consequently, the above-mentioned differential signal occurring at the output terminal of the differential amplifier 103*a*, or namely, this differential signal generated at the differential amplifier 103*a* with reference to the positive power supply voltage +VL, is level-shifted by the pull-up function of the resistor R2*a* to the signal Psa (whose amplitude varies between the positive power supply voltage +VH and the ground potential, with the positive power supply voltage +VH as a reference value) and is then supplied to the voltage amplifier 104*a*.

When designing the class D amplifier 100 of this embodiment, the resistance ratio between the resistor R1*a* connected to the input of the differential amplifier 103*a*, and the resistor R2*a* that realizes a pull-up function is determined to be a specified value and the bias of the signal Psa is set to a specified potential. This makes it possible to always stabilize the bias potential of the drive signal Pga as well as adjust the bias to a gate bias point suitable to operate the transistor FETa in a push-pull manner.

Figure 1:
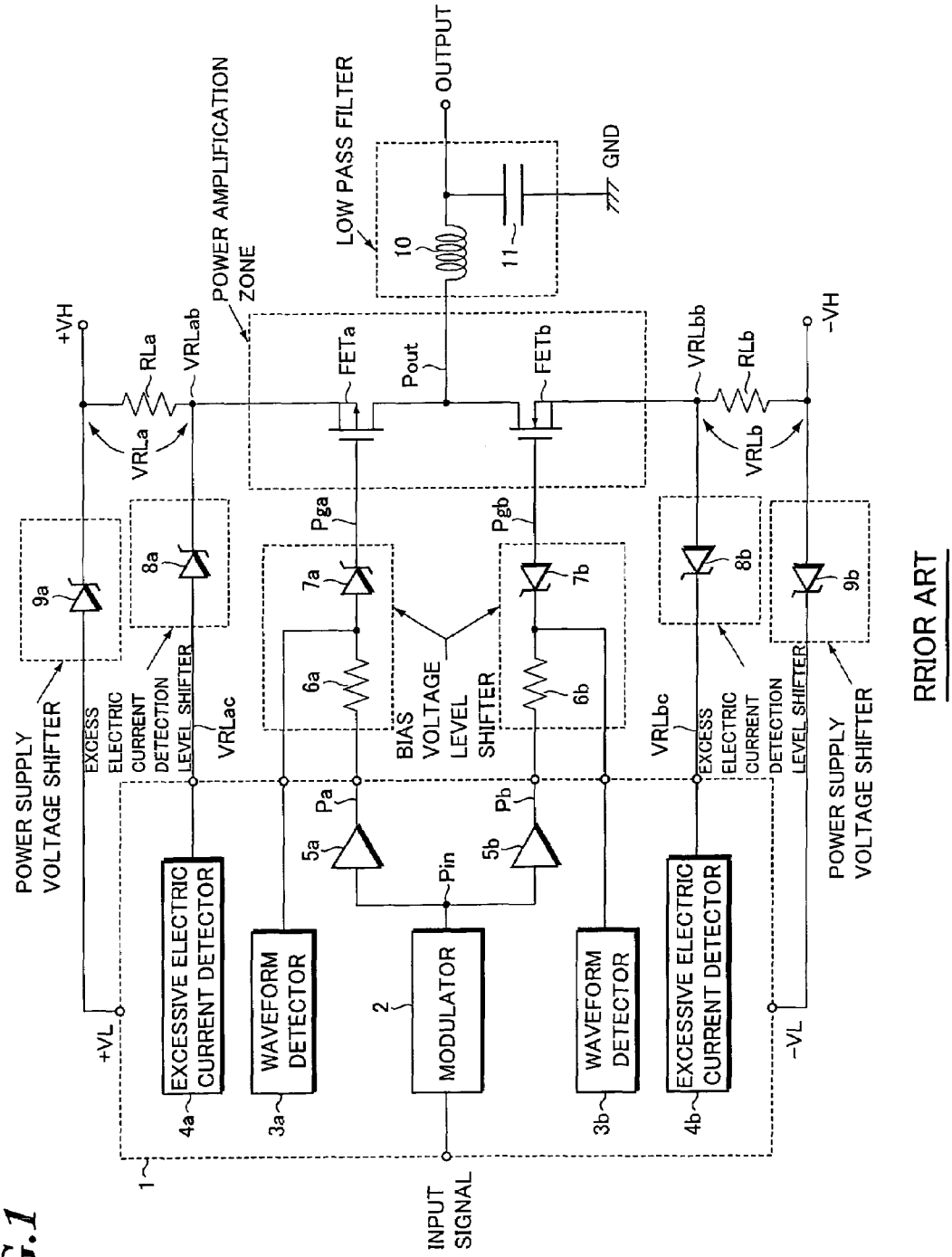
FIG. 1 is a circuit diagram showing the configuration of a conventional class D amplifier.
Figure 2:
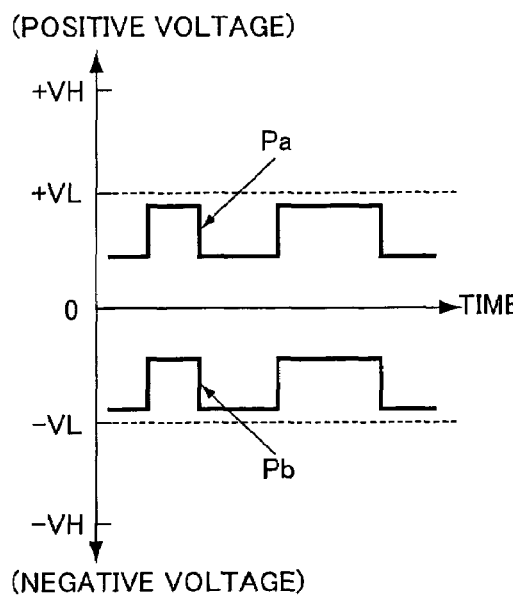
FIG. 2 describes the operation of the bias voltage level shifter and the excess electric current detection level shifter provided in the conventional class D amplifier shown FIG. 1.
Figure 2:
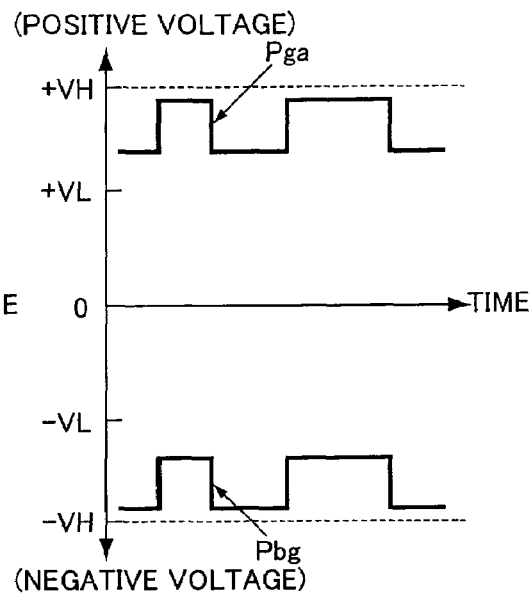
Figure 2:
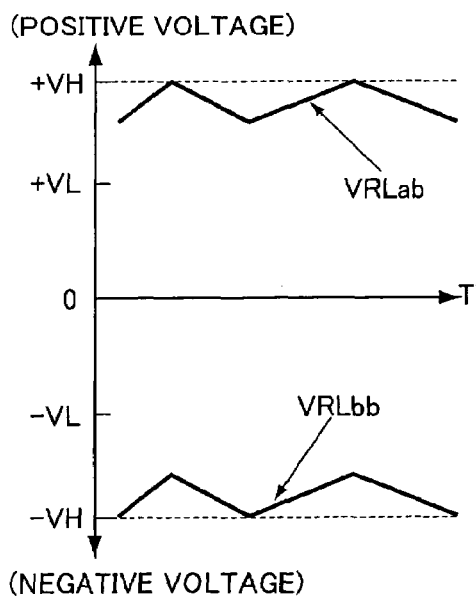
Figure 2:
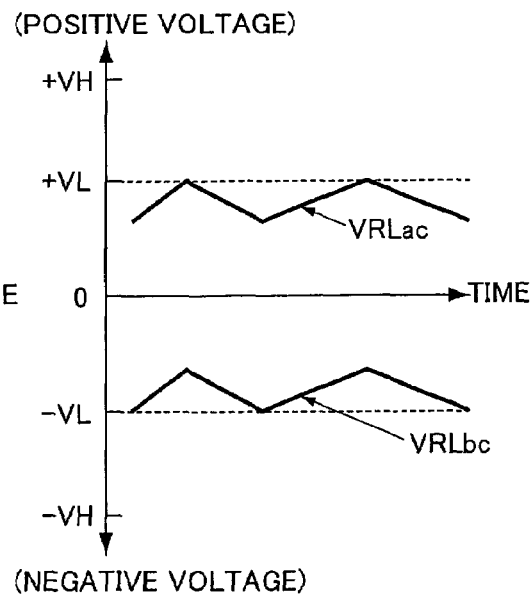

In other words, in like manner to FIG. 2(*a*) and 2(*b*), the bias voltage level shifter 102*a* makes it possible to level shift a square-wave input modulated signal Pa, that varies within a voltage range between the ground potential and the positive power supply voltage +VL, to a square-wave drive signal Pga, that varies within a voltage range between the ground potential and the positive power supply voltage +VH and always stabilize the bias voltage as that level-shifted quantity.

Moreover, forming electrical wiring that should supply the drive signal Pga to the waveform detector 3*a* allows the waveform detector 3*a* to analyze for the presence of waveform distortions in the drive signal Pga.

Next, the configuration of the bias voltage level shifter 102*b* will be described.

The bias voltage level shifter 102*b* comprises a differential amplifier 103*b*, a resistor R2*b*, and a voltage amplifier 104*b*. The differential amplifier 103*b* receives the input modulated signal Pb supplied through resistor R1*b* from an amplifier 5*b* provided in the semiconductor integrated circuit device 1 and then outputs a differential signal that corresponds to the voltage difference between the input modulated signal Pb and the negative power supply voltage −VL. The resistor R2*b* is connected between the power supply terminal of the negative power supply voltage −VH and the output terminal (output terminal where differential signals are output) of the differential amplifier 103*b*. The voltage amplifier 104*b* performs voltage amplification of a signal Psb generated at the output terminal of the differential amplifier 103*b* and then generates the drive signal Pgb to be supplied to the gate of the transistor FETb.

Here, the resistor R2*b* serves as second bias means that realizes a function that connects the power supply terminal of the negative power supply voltage −VH to the output terminal of the differential amplifier 103*b*, thereby pulling down the potential of the output terminal of the differential amplifier 103*b* towards the negative power supply voltage −VH.

Consequently, the above-mentioned differential signal occurring at the output terminal of the differential amplifier 103*b*, or namely, this differential signal generated at the differential amplifier 103*b* with reference to the negative power supply voltage −VL, is level-shifted by the pull-down function of the resistor R2*b* to the signal Psb (whose amplitude varies between the negative power supply voltage −VH and the ground potential, with the negative power supply voltage −VH as a reference value) and is then supplied to the voltage amplifier 104*b*.

When designing the class D amplifier 100 of this embodiment, the resistance ratio between the resistor R1*b* connected to the input of the differential amplifier 103*b*, and the resistor R2*b* that realizes a pull-down function is determined to be a specified value and the bias of the signal Psb is set to a specified potential. This makes it possible to always stabilize the bias potential of the drive signal Pgb as well as adjust the bias to a gate bias point suitable to operate the transistor FETb in a push-pull manner.

In other words, in like manner to FIG. 2(*a*) and 2(*b*), the bias voltage level shifter 102*b* makes it possible to level shift a square-wave input modulated signal Pb, that varies within a voltage range between the ground potential and the negative power supply voltage −VL, to a square-wave drive signal Pgb, that varies within a voltage range between the ground potential and the negative power supply voltage −VH and always stabilize the bias voltage as that level-shifted quantity.

Moreover, forming electrical wiring that should supply the drive signal Pgb to the waveform detector 3*b* allows the waveform detector 3*b* to analyze for the presence of waveform distortions in the drive signal Pgb.

Next, the configuration of the current mirror circuit 101*a* will be described.

This current mirror circuit 101*a* operates within a voltage range between the positive power supply voltage +VH and the ground potential. The current mirror circuit 101*a* has two input terminals Xa1 and Xa2 connected to respective ends of the resistor RLa, an output terminal Ya1 connected to the ground terminal GND, and an output terminal Ya2 connected to the excessive electric current detector 4*a*. A transistor pair (not shown in figure) is connected between these input terminals Xa1, Xa2 and output terminals Ya1, Ya2 and operates as a current mirror.

In other words, this transistor pair is formed by, for example, two PNP transistors whose bases are connected together while one of the PNP transistors has a collector connected a base thereof.

The emitter of the PNP transistor whose collector and base are connected (PNP transistor that essentially functions as a diode and is referred to as a "first PNP transistor" hereinafter) is connected to an input terminal Xa1. A resistor with a specified value (hereinafter referred to as a "reference current setting resistor") is connected between the collector of the first PNP transistor and the output terminal Ya1. Moreover, the emitter of the other PNP transistor of the transistor pair (hereinafter referred to as a "second PNP transistor") is connected to the input terminal Xa2 and the collector of the second PNP transistor is connected to the excessive electric current detector 4a through the output terminal Ya2.

The surface area (emitter size) of the emitter of the second PNP transistor connected between the input terminal Xa2 and the output terminal Ya2 is smaller compared to the surface area (emitter size) of the emitter of the first PNP transistor connected between the input terminal Xa1 and the output terminal Ya1.

As a result, compared to the voltage between the base and the emitter required to operate the first PNP transistor in an ON state, the voltage between the base and the emitter required to operate the second PNP transistor in an ON state is higher and the deadband of the second PNP transistor is larger. The voltage of this deadband is employed as a threshold value to detect an excessive electric current.

In the current mirror circuit 101*a* with such a configuration described above, an electric current Ira flows from the resistor RLa to the input terminal Xa1 and then flows to the ground through the first PNP transistor (PNP transistor that functions as a diode), the reference current setting resistor, and the output terminal Ya1. This electric current Ira is employed as a reference electric current with a specified electric current value.

Almost no electric current flows in the second PNP transistor, that has a deadband, until an excessive electric current is flowing in the resistor RLa. On the other hand however, if an excessive electric current is flowing in the resistor RLa, the second PNP transistor will turn ON by applying a higher voltage than the voltage of the deadband between the base and the emitter of the second PNP transistor as falling voltage VRLa, that occurs at the resistor RLa, becomes larger. Then, the excessive electric current detection current Ia, that functions as an excessive electric current detection signal nearly proportional to the excessive electric current, is output from the second PNP transistor to the excessive electric current detector 4*a* through the output terminal Ya2.

In this manner, the current mirror circuit 101*a* can detect an excessive electric current flowing in the transistor FETa through the resistor RLa and can supply that detection information to the excessive electric current detector 4*a*.

Since the collector of the second PNP transistor is connected to this excessive electric current detector 4*a*, the output impedance is extremely high for the excessive electric current detector 4*a* (namely, functions as a constant-current power source). Because of this, even if the voltages of the power supply voltages +VL, −VL and the voltages of the power supply voltages +VH, −VLH are different, it is possible to make a process that performs level shifting the detected excessive electric current to an excessive electric current detection current Ia essentially unnecessary and also to reliably supply the excessive electric current detection current Ia, that shows the excessive electric current detection information, to the excessive electric current detector 4*a*.

Although the configuration that supplies an excessive electric current detection current Ia to the excessive electric current detector 4*a* was described, a resistor that functions as a current-voltage converter can be connected between the collector of the second PNP transistor and the excessive electric current detector 4*a*. The excessive electric current detection current Ia can then undergo current-voltage conversion to become an excessive electric current detection voltage which is then supplied to the excessive electric current detector 4*a*.

Furthermore, although a description was provided when using a transistor pair composed of two PNP transistors to form the current mirror circuit 101*a*, another transistor can be used to form the current mirror circuit such as a field-effect transistor.

Next, the configuration of the current mirror circuit 101*b* will be described.

This current mirror circuit 101*b* operates within a voltage range between the negative power supply voltage −VH and the ground potential. The current mirror circuit 101*b* also has a configuration identical to the current mirror circuit 101*a*.

Namely, in place of the first PNP transistor and the second PNP transistor, the current mirror circuit 101*b* has a transistor pair commonly connected between both bases of a first NPN transistor (not shown in figure) and a second NPN transistor (not shown in figure).

The emitter of the first NPN transistor (NPN transistor whose base and collector are connected to function as a diode) is connected to a connection point between the resistor RLb and the transistor FETb through the input terminal Xb1. Furthermore, the second NPN transistor is connected at its collector to the ground terminal GND through a reference current setting resistor identical to the above-mentioned reference current setting resistor provided in the current mirror circuit 101*a* and also through the output terminal Yb1.

In contrast, the emitter of the second NPN transistor is connected to the power supply voltage −VH of the resistor RLb through the input terminal Xb2 and the collector of the second NPN transistor is connected to the excessive electric current detector 4*b*.

The surface area of the emitter of the second NPN transistor connected between the input terminal Xb2 and the output terminal Yb2 is smaller compared to the surface area of the emitter of the first NPN transistor connected between the input terminal Xb1 and the output terminal Yb1.

As a result, compared to the voltage between the base and the emitter required to operate the first NPN transistor in an ON state, the voltage between the base and the emitter required to operate the second NPN transistor in an ON state is higher and the deadband of the second NPN transistor is larger. The voltage of this deadband is employed as a threshold value to detect an excessive electric current.

In the current mirror circuit 101*b* with such a configuration described above, an electric current Irb flows from the ground terminal GND to the first NPN transistor (NPN transistor that functions as a diode). This electric current Irb is employed as a reference electric current with a specified electric current value.

Almost no electric current flows in the second NPN transistor, that has a deadband, until an excessive electric current is flowing in the resistor RLb. On the other hand however, if an excessive electric current is flowing in the resistor RLb, the second NPN transistor will turn ON by applying a higher voltage than the voltage of the deadband between the base and the emitter of the second NPN transistor as falling voltage VRLa, that occurs at the resistor RLa, becomes larger. Then, the excessive electric current detection current Ib (namely, sink current (absorption current)), that functions as an excessive electric current detection signal nearly proportional to the excessive electric current, is supplied from the second NPN transistor to the excessive electric current detector 4b through the output terminal Yb2.

In other words, an identical operation is performed in which an excessive electric current detection current Ib is supplied to the excessive electric current detector 4b because the second NPN transistor sinks the excessive electric current detection current Ib.

In this manner, the current mirror circuit 101b can detect an excessive electric current flowing in the transistor FETb through the resistor RLb and supply that detection information to the excessive electric current detector 4b.

Since the collector of the second NPN transistor is connected to this excessive electric current detector 4b, the output impedance is extremely high for the excessive electric current detector 4b (namely, functions as a constant-current power source). Because of this, even if the voltages of the power supply voltages +VL, −VL and the voltages of the power supply voltages +VH, −VLH are different, it is possible to detect an excessive electric current flowing in the transistor FETb and to reliably supply an excessive electric current detection current Ib, that shows the excessive electric current detection information, to the excessive electric current detector 4b.

Although the configuration that supplies an excessive electric current detection current Ib to the excessive electric current detector 4b was described, a resistor that functions as a current-voltage converter can be connected between the collector of the second NPN transistor and the excessive electric current detector 4b. The excessive electric current detection current Ib can then undergo current-voltage conversion to become an excessive electric current detection voltage which is then supplied to the excessive electric current detector 4b.

Furthermore, although a description was provided when using a transistor pair composed of two NPN transistors to form the current mirror circuit 101b, another transistor can be used to form the current mirror circuit such as a field-effect transistor.

According to the class D amplifier 100 of the present embodiment as described above, drive signals Pga, Pgb which are at a bias point suitable for the transistors FETa, FETb to operate in a push-pull manner can be supplied to these transistors FETa, FETb because the bias voltage level shifters 102a and 102b, that generate level-shifted signals Psa and Psb, are provided. Here, the bias voltage level shifter 102a uses the resistor R2a to pull up a differential signal, that corresponds to the difference between the input modulated signal Pa and the positive power supply voltage +VL, to the positive power supply voltage +VH as well as the bias voltage level shifter 102b uses the resistor R2b to pull down a differential signal, that corresponds to the difference between the input modulated signal Pb and the negative power supply voltage −VL, to the negative power supply voltage −VH.

As a result, an output modulated signal Pout can be output from the transistors FETa and FETb without any waveform distortions, making it possible to perform efficient power amplification. Moreover, it is also possible to prevent a load that exceeds the allowable power loss from being applied to the transistors FETa and FETb, thereby making it possible to prevent a state in which damage to the transistors occurs.

Because the current mirror circuits 101a and 101b, which serve as excessive electric current detection means, have a high output impedance for the excessive electric current detectors 4a and 4b, even if the power supply voltages +VL, −VL and the power supply voltages +VH, −VLH are different, it is possible to make a process that performs level shifting the detected excessive electric current to the excessive electric current detection currents Ia, Ib essentially unnecessary. As a result, excessive electric current detection means can be provided that has a new configuration and does not require taking into consideration variations in level shifts due to Zener diodes which has been a problem with conventional technology. It is also possible to reliably supply excessive electric current detection currents Ia and Ib, which indicate that an excessive electric current is flowing in the transistors FETa and FETb, to the excessive electric current detectors 4a and 4b.

EXAMPLE

Next, a concrete example will be described in more detail with reference to FIG. 4 and FIG. 5.

Figure 4:
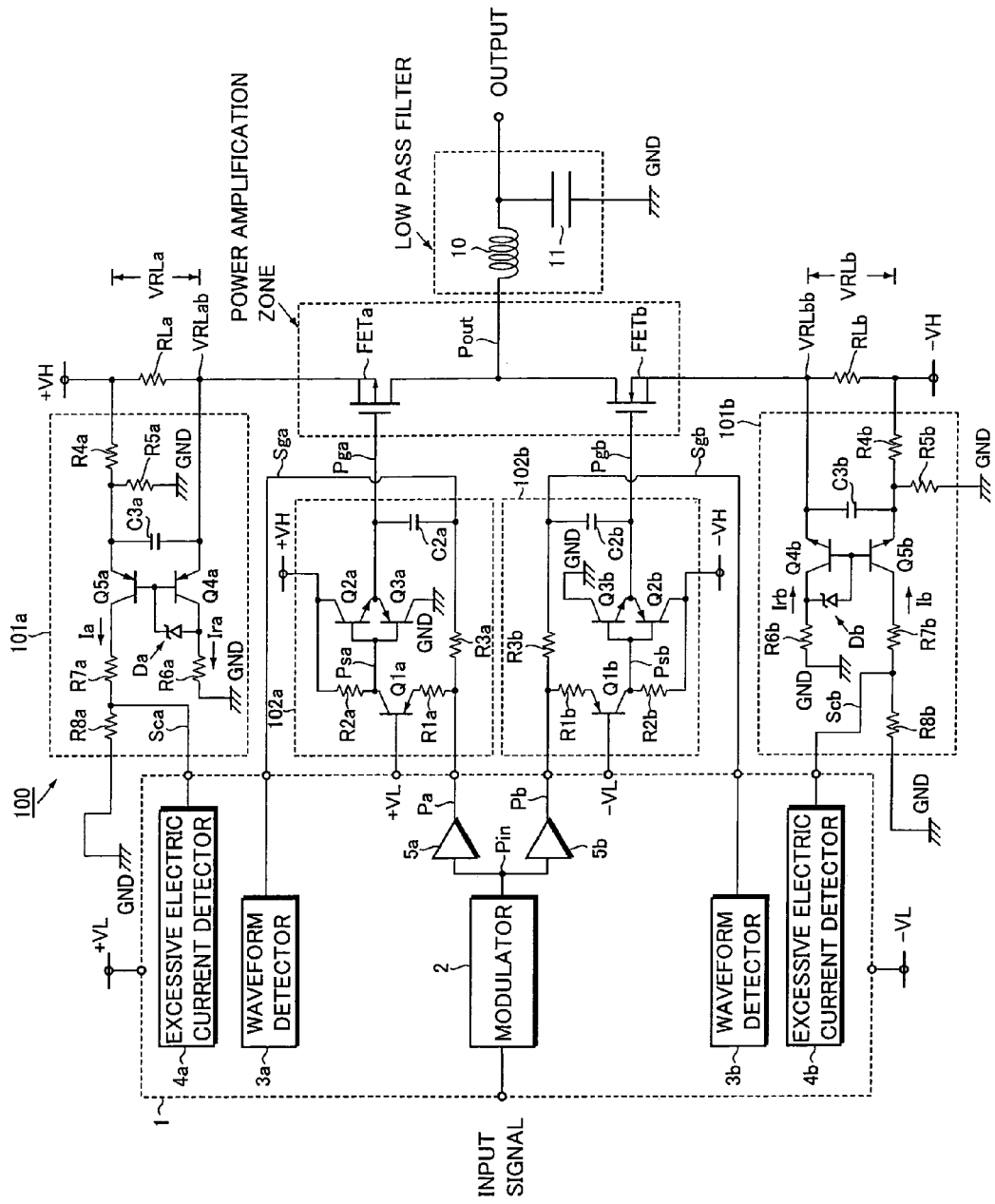
FIG. 4 is a circuit diagram showing the exemplary configuration of a class D amplifier according to the present invention.
Figure 5A:
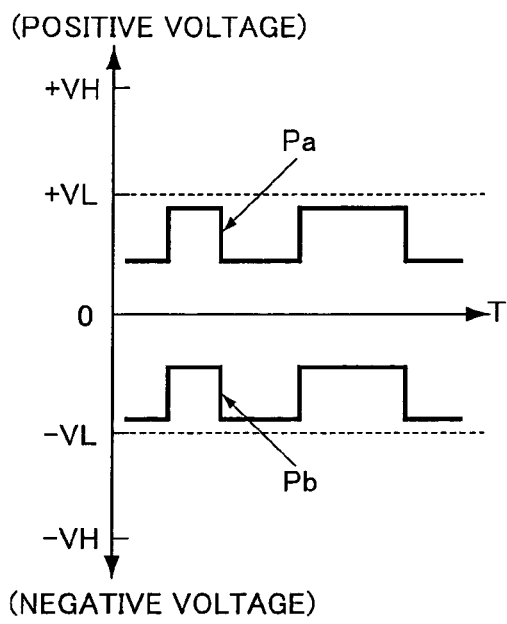
FIG. 5 describes the operation of the class D amplifier shown in FIG. 4.
Figure 5:
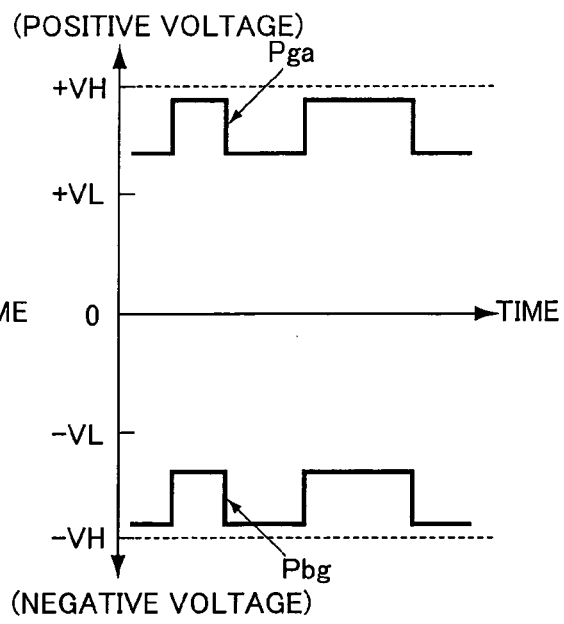
Figure 5:
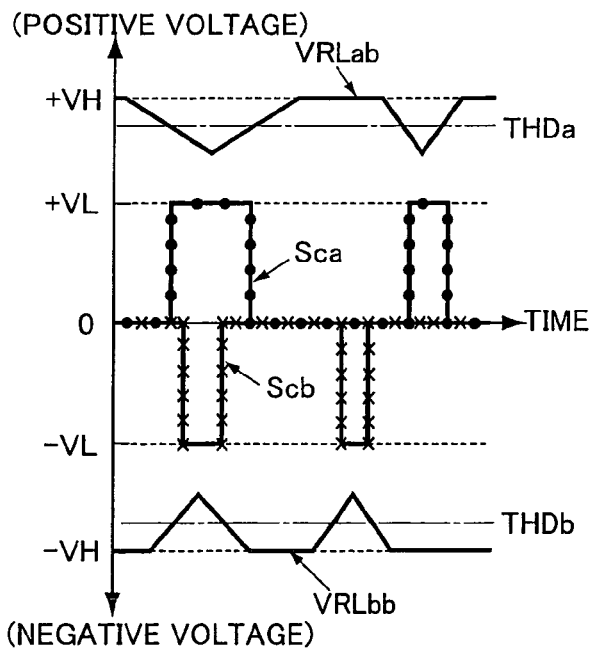

FIG. 4 is a schematic diagram showing the configuration of the class D amplifier 100 of the example. Parts identical or equivalent to those showing in FIG. 3 are denoted by the same symbols. FIG. 5 describes the operation of the class D amplifier 100 of this example. In particular, FIGS. 5(a) and 5(b) describe the operation of the bias voltage level shifters 102a and 102b (described later) and FIG. 5(c) describes the operation of the current mirror circuits 101a and 101b which serve as excessive electric current detection means (described later).

In the following the characteristic parts of the configuration of the class D amplifier 100 in this example is described compared with the class D amplifier according to the embodiment shown in FIG. 3.

The bias voltage level shifter 102a provided in the class D amplifier 100 of this example comprises resistors R1a and R2a, an NPN transistor Q1a, and a push-pull circuit composed of an NPN transistor Q2a and a PNP transistor Q3a Now, wiring is formed such that the positive power supply voltage +VL is applied to the base of the NPN transistor Q1a and the input modulated signal Pa, output from the amplifier 5a of the semiconductor integrated circuit device 1, is input to the emitter of the NPN transistor Q1a through the resistor R1a. In addition, the collector of the NPN transistor Q1a is connected to the power supply terminal of the positive power supply voltage +VH through the resistor R2a.

The circuit configuration obtained by the resistors R1a and R2a and the NPN transistor Q1a realizes a circuit that has a differential amplifier 103a, mentioned in the description of the embodiment, and a resistor R1b that exhibits a pull-up function.

The push-pull circuit composed of the NPN transistor Q2a and the PNP transistor Q3a which operate within a voltage range between the positive power supply voltage +VH and the ground potential realizes the voltage amplifier 104a mentioned in the description of the embodiment.

When the input modulated signal Pa is input to the NPN transistor Q1a through the resistor R1a, the NPN transistor Q1a generates a collector current corresponding to the difference between the input modulated signal Pa and the positive power supply voltage +VL which in turn allows to generate a differential signal that is proportional to the collector current at both ends of the resistor R1a. Because the resistor R1a is connected to the power supply terminal of the positive power supply voltage +VH, a function that pulls up the collector potential of the NPN transistor Q1a is achieved and the above-mentioned differential signal that occurs at the collector of the NPN transistor Q1a is supplied to the push-pull circuit composed of the NPN transistor Q2a and the PNP transistor Q3a as a signal Psa level-shifted towards the positive power supply voltage +VH side. Then, the drive signal Pga to be supplied to the gate of the P-channel field-effect transistor FETa is generated.

In this manner, the bias voltage level shifter 102a can generate the signal Psa proportional to the differential signal (collector current) that corresponds to the difference between the positive power supply voltage +VL and the input modulated signal Pa using the circuit composed of the NPN transistor Q1a and the resistors R1a and R2a as well as use the resistor R2a to stabilize a bias voltage corresponding to the level-shifted quantity of the signal Psa. Consequently, as illustrated in FIG. 5(a) and 5(b), it is possible to match the bias point of the drive signal Pga, that maintains a similar relationship with the waveform of the input modulated signal Pa, to a gate bias point suitable to operate the transistor FETa in a push-pull manner.

A resistor R3a and a capacitor C2a are connected in series between both emitters of the NPN transistor Q2a and the PNP transistor Q3a, and the amplifier 5a. The connection point between the resistor R3a and the capacitor C2a is connected to the waveform detector 3a. A signal Sga (hereinafter referred to as a "mixed signal") is generated by superimposing the alternating-current component of the drive signal Pga onto the direct-current component of the input modulated signal Pa at the connection point between the resistor R3a and the capacitor C2a by means of forming the related circuit configuration and wiring.

Because this mixed signal Sga is a signal equal to the level-shifted drive signal Pga that matches the so-called operating point of the waveform detector 3a that operates between the positive power supply voltage +VL and the ground potential, the waveform detector 3a is allowed to analyze signal waveforms which are input into the gate of the transistor FETa.

Next, the configuration of bias voltage level shifter 102b of this embodiment will be described.

This bias voltage level shifter 102b has a configuration identical to the bias voltage level shifter 102a and has resistors R1b and R2b, a PNP transistor Q1b, a push-pull circuit composed of an NPN transistor Q3b and a PNP transistor Q2b.

Now, wiring is formed such that the negative power supply voltage −VL is applied to the base of the PNP transistor Q1b and the input modulated signal Pb, output from the amplifier 5b of the semiconductor integrated circuit device 1, is input to the emitter of the PNP transistor Q1b through the resistor R1b. In addition, the collector of the PNP transistor Q1b is connected to the power supply terminal of the negative power supply voltage −VH through the resistor R2b.

The circuit configuration obtained by the resistors R1b and R2b and the PNP transistor Q1b realizes a circuit that has a differential amplifier 103b, mentioned in the description of the embodiment, and a resistor R2b that exhibits a pull-down function.

The push-pull circuit composed of the NPN transistor Q3b and the PNP transistor Q2b which operate within a voltage range between the negative power supply voltage −VH and the ground potential realizes the voltage amplifier 104b mentioned in the description of the embodiment.

When the input modulated signal Pb is input to the PNP transistor Q1b through the resistor R1b, the NPN transistor Q1a generates a collector current corresponding to the difference between the input modulated signal Pb and the negative power supply voltage −VL which in turn allows to generate a differential signal that is proportional to the collector current at both ends of the resistor R2b. Because the resistor R2b is connected to the power supply terminal of the negative power supply voltage −VH, a function that pulls down the collector potential of the PNP transistor Q1b is achieved and the above-mentioned differential signal that occurs at the collector of the PNP transistor Q1b is supplied to the push-pull circuit composed of the NPN transistor Q3b and the PNP transistor Q2b as a signal Psb level-shifted towards the negative power supply voltage −VH. Then, the drive signal Pgb to be supplied to the gate of the N-channel field-effect transistor FETb is generated.

In this manner, the bias voltage level shifter 102b can generate the signal Psb proportional to the differential signal (collector current) that corresponds to the difference between the negative power supply voltage −VL and the input modulated signal Pb using the circuit composed of the PNP transistor Q1b and the resistors R1b and R2b as well as use the resistor R2b to stabilize a bias voltage corresponding to the level-shifted quantity of the signal Psb. Consequently, as illustrated in FIGS. 5(a) and 5(b), it is possible to match the bias point of the drive signal Pgb, that maintains a similar relationship with the waveform of the input modulated signal Pb, to a gate bias point suitable to operate the transistor FETb in a push-pull manner.

A resistor R3b and a capacitor C2b are connected in series between both emitters of the NPN transistor Q3b and the PNP transistor Q2b, and the amplifier 5b. The connection point between the resistor R3b and the capacitor C2b is connected to the waveform detector 3b. A signal Sgb (mixed signal) is generated by superimposing the alternating-current component of the drive signal Pgb onto the direct-current component of the input modulated signal Pb at the connection point between the resistor R3b and the capacitor C2b by means of forming the related circuit configuration and wiring.

Because this mixed signal Sgb is a signal equal to the level-shifted drive signal Pgb that matches the so-called operating point of the waveform detector 3b that operates between the negative power supply voltage −VL and the ground potential, the waveform detector 3b is allowed to analyze signal waveforms which are input into the gate of the transistor FETb.

Next, the configuration of the current mirror circuit 101a will be described.

This current mirror circuit 101a comprises a transistor pair composed of a first PNP transistor Q4a and a second PNP transistor Q5a, resistors R4a, R5a, R6a, R7a, and R8a, a capacitor C3a, and a Zener diode Da.

The bases of both the PNP transistors Q4a and Q5a are connected together and the capacitor C3a is connected between both emitters thereof to function as a low pass filter.

The resistors R4a and R5a are connected in series between the power supply terminal of the positive power supply voltage +VH and the ground terminal GND. The emitter of the PNP transistor Q5a is connected to the connection point of these resistors R4a and R5a. The resistors R7a and R8a are connected in series between the collector of the PNP transistor Q5a and the ground terminal GND. The excessive electric current detector 4a is connected to the connection point of the resistors R7a and R8a.

The Zener diode Da is connected between the collector and the base of the PNP transistor Q4a to control the early effect and the collector of the transistor is connected to the ground terminal GND through the resistor R6a that functions as a reference current setting resistor. The emitter thereof is connected to the connection point between the resistor RLa and the transistor FETa.

In addition, the surface area (emitter size) of the emitter of the PNP transistor Q5a is smaller compared to the surface area (emitter size) of the emitter of the PNP transistor Q4a. As a result, compared to the voltage between the base and the emitter required to operate the PNP transistor Q4a in an ON state, the voltage between the base and the emitter required to operate the PNP transistor Q5a in an ON state is higher and the so-called deadband of the PNP transistor Q5a is larger. The voltage of this deadband is employed as a threshold value to detect an excessive electric current.

In the current mirror circuit 101a with such a configuration described above, an electric current Ira that flows from the resistor RLa and then flows to the ground terminal GND through the PNP transistor Q4a and the resistor R6a serves as a reference electric current with a specified electric current value.

When there is no excessive electric current flowing in the resistor RLa, almost no electric current will flow in the PNP transistor Q5a, that has a deadband, while a GND voltage will be applied to the excessive electric current detector 4a through the resistor R8a and this GND voltage will be detected by the excessive electric current detector 4a. Because of this, the fact that no excessive electric current is flowing will be known.

In contrast, if an excessive electric current is flowing in the resistor RLa, the emitter voltage VRLab of the PNP transistor Q4a will fall (drop) in accordance with the falling voltage VRLa that occurs at the resistor RLa due to the excessive electric current and a fixed divided voltage that has undergone voltage division by the resistors R4a and R5a will always be applied to the emitter of the PNP transistor Q5a. Consequently, the emitter voltage of the PNP transistor Q5a is constantly maintained. Because of this, if the voltage applied between the emitters of the PNP transistors Q4a and Q5a becomes larger in accordance with the falling voltage VRLa along with the voltage applied between those emitters exceeding the deadband voltage (namely, the threshold value) THDa of the PNP transistor Q5a, the PNP transistor Q5a will be in an ON state and the excessive electric current detection current Ia, which shows that the excessive electric current is occurring, will flow out to the resistor 7a.

As shown in FIG. 5(c), As a result of a falling voltage occurring at the resistor R8a proportional to the excessive electric current detection current Ia, an excessive electric current detection voltage Sca, a voltage higher than the GND voltage, is applied to and detected by the excessive electric current detector 4a, thereby making it possible to know that an excessive electric current is flowing.

In other words, the relationship of the following formulas (1) and (2) is established for the circuit configuration of the emitter side of the PNP transistors Q4a and Q5a, where |VRLa| is the absolute value of the falling voltage occurring at the resistor RLa when an excessive electric current is flowing, Vbe(4a) is the voltage between the base and the emitter of the PNP transistor Q4a through which the reference current Ira is always flowing, Vbe(5a) is the voltage between the base and the emitter when the PNP transistor Q5ag is in an ON state, and Vadev is the divided voltage (voltage at both ends of the resistor R4a) that has undergone voltage division by the resistors R4a and R5a.

$$Vadev = \frac{R4a \cdot (+VH)}{R4a + R5a} \quad (1)$$

$$Vbe(5a) = |VRLa| - Vadev - Vbe(4a) \quad (2)$$

Since the divided voltage Vadev is a fixed voltage, as a result of the flowing of an excessive electric current the PNP transistor Q5a is turned ON if the absolute value of the falling voltage |VRLa| is a voltage higher than the voltage of (Vadev+Vbe(4a)). The excessive electric current detection current Ia then flows out to the resistor 7a, thereby making it possible to generate an excessive electric current detection voltage Sca and inform the electric current detector 4a that an excessive electric current has occurred as shown in FIG. 5(c).

It is also possible to adjust the detection sensitivity of the excessive electric current by adjusting the resistance ratio of the resistors R4a and R5a and the ratio of the emitter surface areas (emitter size ratio) of the PNP transistors Q4a and Q5a.

The output impedance as seen at the collector of the PNP transistor Q5a from the excessive electric current detector 4a is extremely high. Therefore, even if the power supply voltages +VL, -VL of the excessive electric current detector 4a and the power supply voltages +VH, -VLH of the class D amplifier 100 are different, it is possible to make a process that performs level shifting of the detected excessive electric current to generate an excessive electric current detection signal Ia essentially unnecessary. It is also possible to reliably supply an excessive electric current detection current Ia, that shows the excessive electric current occurrence information, to the excessive electric current detector 4a.

In the current mirror circuit 101a of this example, although an excessive electric current detection current Ia undergoes current-voltage conversion to an excessive electric current detection voltage by the resistors R7a and R8a and is then supplied to the excessive electric current detector 4a, the resistors R7a and R8a can be omitted and an excessive electric current detection current Ia can be directly supplied to the excessive electric current detector 4a.

In addition, although using a transistor pair composed of two PNP transistors Q4a and Q5a to form the current mirror circuit 101a was described, another transistor, such as a field-effect transistor, can also be used to form the current mirror circuit 101a.

Next, the configuration of the current mirror circuit 101b will be described.

This current mirror circuit 101b also has a configuration identical to the current mirror circuit 101a.

In other words, the current mirror circuit 101b comprises a transistor pair composed of a first NPN transistor Q4b and a second NPN transistor Q5b, resistors R4b, R5b, R6b, R7b, and R8b, a capacitor C3b, and a Zener diode Db.

The bases of both the NPN transistors Q4b and Q5b are connected together and the capacitor C3b is connected between both emitters thereof.

The resistors R4b and R5b are connected in series between the power supply terminal of the negative power supply voltage -VH and the ground terminal GND. The emitter of the NPN transistor Q5b is connected to the connection point of these resistors R4b and R5b. The resistors R7b and R8b are connected in series between the collector of the NPN transistor Q5b and the ground terminal GND. The excessive electric current detector 4b is connected to the connection point of the resistors R7b and R8b.

The Zener diode Db is connected between the collector and the base of the NPN transistor Q4b to control the early effect and the collector of the transistor is connected to the ground terminal GND through the resistor R6b that functions as a reference current setting resistor. The emitter thereof is connected to the connection point between the resistor RLb and the transistor FETb.

In addition, the surface area (emitter size) of the emitter of the NPN transistor Q5b is smaller compared to the surface area (emitter size) of the emitter of the NPN transistor Q4b. As a result, compared to the voltage between the base and the emitter required to operate the NPN transistor Q4b in an ON state, the voltage between the base and the emitter required to operate the NPN transistor Q5b in an ON state is higher and the so-called deadband of the NPN transistor Q5a is larger. The voltage of this deadband is employed as a threshold value to detect an excessive electric current.

In the current mirror circuit 101b with such a configuration described above, an electric current Irb that flows from the ground terminal GND to the NPN transistor Q4b through the resistor R6b serves as a reference electric current with a specified electric current value.

When there is no excessive electric current flowing in the resistor RLb, almost no electric current will flow in the NPN transistor Q5b, that has a deadband, while a GND voltage will be applied to the excessive electric current detector 4b through the resistor R8b and this GND voltage will be detected by the excessive electric current detector 4b. Because of this, the fact that no excessive electric current is flowing will be known.

In contrast, if an excessive electric current is flowing in the resistor RLb, the emitter voltage VRLab of the NPN transistor Q4b will rise in accordance with the falling voltage VRLb that occurs at the resistor RLb due to the excessive electric current and a fixed divided voltage that has undergone voltage division by the resistors R4b and R5b will always be applied to the emitter of the NPN transistor Q5b. Consequently, the emitter voltage of the NPN transistor Q5b is constantly maintained. Because of this, if the voltage applied between the emitters of the NPN transistors Q4b and Q5b becomes larger in accordance with the falling voltage VRLb along with the voltage applied between those emitters exceeding the deadband voltage (namely, the threshold value) THDb of the NPN transistor Q5b, the NPN transistor Q5b will be in an ON state and the excessive electric current detection current Ib, which shows that the excessive electric current is occurring, will flow out to the resistor 7b.

As shown in FIG. 5(c), as a result of a falling voltage occurring at the resistor R8b proportional to the excessive electric current detection current Ib. an excessive electric current detection voltage Scb, a voltage lower than the GND voltage, is applied to and detected by the excessive electric current detector 4b, thereby making it possible to know that an excessive electric current is flowing.

In other words, the relationship of the following formulas (3) and (4) is established for the circuit configuration of the emitter side of the NPN transistors Q4b and Q5b, where |VRLb| is the absolute value of the falling voltage occurring at the resistor RLb when an excessive electric current is flowing, Vbe(4b) is the voltage between the base and the emitter of the NPN transistor Q4b through which the reference current Irb is always flowing, Vbe(5b) is the voltage between the base and the emitter when the NPN transistor Q5bg is in an ON state, and Vbdev is the divided voltage (voltage at both ends of the resistor R4b) that has undergone voltage division by the resistors R4b and R5b.

$$Vbdev = \frac{R4b \cdot (-VH)}{R4b + R5b} \quad (3)$$

$$Vbe(5b) = |VRLb| - Vbdev - Vbe(4b) \quad (4)$$

Since the divided voltage Vbdev is a fixed voltage, as a result of the flowing of an excessive electric current the NPN transistor Q5b is turned ON if the absolute value of the falling voltage |VRLb| is a voltage higher than the voltage of (Vbdev+Vbe(4b)). The excessive electric current detection current Ib then flows out to the resistor 7b, thereby making it possible to generate an excessive electric current detection voltage Scb and inform the electric current detector 4b that an excessive electric current has occurred as shown in FIG. 5(c).

It is also possible to adjust the detection sensitivity of the excessive electric current by adjusting the resistance ratio of the resistors R4b and R5b and the ratio of the emitter surface areas (emitter size ratio) of the NPN transistors Q4b and Q5b.

The output impedance as seen at the collector of the NPN transistor Q5b from the excessive electric current detector 4b is extremely high. Therefore, even if the power supply voltages +VL, −VL of the excessive electric current detector 4b and the power supply voltages +VH, −VLH of the class D amplifier 100 are different, it is possible to make a process that performs level shifting of the detected excessive electric current to generate an excessive electric current detection signal Ib essentially unnecessary. It is also possible to reliably supply an excessive electric current detection current Ib, that shows the excessive electric current occurrence information, to the excessive electric current detector 4b.

In the current mirror circuit 101b of this example, although an excessive electric current detection current Ib undergoes current-voltage conversion to an excessive electric current detection voltage by the resistors R7b and R8b and is then supplied to the excessive electric current detector 4b, the resistors R7b and R8b can be omitted and an excessive electric current detection current Ib can be directly supplied to the excessive electric current detector 4b.

In addition, although using a transistor pair composed of two NPN transistors Q4b and Q5b to form the current mirror circuit 101b was described, another transistor, such as a field-effect transistor, can also be used to form the current mirror circuit 101b.

According to the class D amplifier 100 as described above in the embodiment, the bias voltage level shifters 102a and 120b are provided. The bias voltage level shifter 102a comprises: the NPN transistor Q1a that calculates a differential signal corresponding to the difference between the input modulated signal Pa and the positive power supply voltage +VL; and the resistor R2a that generates the level-shifted signal Psa by pulling up that differential signal towards the positive power supply voltage +VH. The bias voltage level shifter 102b comprises: the PNP transistor Q1b that calculates a differential signal corresponding to the difference between the input modulated signal Pb and the negative power supply voltage −VL; and the resistor R2b that generates the level-shifted signal Psb by pulling down that differential signal towards the negative power supply voltage −VH. Consequently, drive signals Pga and Pgb which each have a bias point suitable for the transistors FETa and FETb to operate in a push-pull manner can be supplied to these transistors FETa and FETb.

As a result, an output modulated signal Pout can be output from the transistors FETa and FETb without any waveform distortions, making it possible to perform efficient power amplification. Moreover, it is also possible to prevent a load that exceeds the allowable power loss from being applied to the transistors FETa and FETb, thereby making it possible to prevent a state in which damage to the transistors occurs.

Because the current mirror circuits 101a and 101b, which serve as excessive electric current detection means, have a high output impedance for the excessive electric current detectors 4a, 4b, even if the power supply voltages +VL, −VL and the power supply voltages +VH, −VLH are different, it is possible to make a process that performs level shifting the detected excessive electric current to excessive electric current detection currents Ia and Ib essentially unnecessary. As a result, any of the aspects of the invention can provide excessive electric current detection means that has a new configuration and does not require taking into consideration variations in level shifts due to Zener diodes which has been a problem with conventional technology. It is also possible to reliably supply excessive electric current detection currents Ia and Ib which indicate that excessive electric current is flowing in the transistors FETa and FETb to the excessive electric current detectors 4a, 4b.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A class D amplifier comprising:
a pair of switching elements composed of first and second switching elements which are complementally symmetrical with respect to high and low voltages of a power supply;
first bias voltage level shift means that generates a drive signal to be supplied to said first switching element by level-shifting a square-wave first input signal; and
second bias voltage level shift means that generates a drive signal to be supplied to said second switching element by level-shifting a square-wave second input signal,
said class D amplifier being provided for performing class D amplification by allowing said first and second switching elements to perform a push-pull operation based on the respective drive signals supplied thereto,
wherein said first bias voltage level shift means has first differential amplification means that calculates a differential signal between said first input signal and a predetermined voltage, and first bias means that generates a level-shifted drive signal to be supplied to said first switching element by pulling up said differential signal towards the power supply voltage of the first switching element,
wherein said second bias voltage level shift means has second differential amplification means that calculates a differential signal between said second input signal and a predetermined voltage, and second bias means that generates a level-shifted drive signal to be supplied to said second switching element by pulling down said differential signal towards the power supply voltage of the second switching element.

2. A class D amplifier having a pair of switching elements composed of first and second switching elements which are complementally symmetrical with respect to high and low voltages of a power supply, said class D amplifier being provided for performing class D amplification by allowing said first and second switching elements to perform a push-pull operation based on the respective square-wave drive signals supplied thereto,
the class D amplifier comprising:
a first resistor connected between said first switching element and said power supply;
a second resistor connected between said second switching element and said power supply;
a first current mirror circuit that receives a falling voltage generated at both ends of said first resistor and generates an electric current corresponding to said falling voltage; and
a second current mirror circuit that receives a falling voltage generated at both ends of said second resistor and generates an electric current corresponding to said falling voltage,
wherein said respective currents output from said first and second current mirror circuits serve as an excessive electric current detection current that shows whether or not excessive electric currents flow in said first and second switching elements.

3. A class D amplifier comprising:
a pair of switching elements composed of first and second switching elements which are complementally symmetrical with respect to high and low voltages of a power supply;
first bias voltage level shift means that generates a drive signal to be supplied to said first switching element by level-shifting a square-wave first input signal; and
second bias voltage level shift means that generates a drive signal to be supplied to said second switching element by level-shifting a square-wave second input signal,
said class D amplifier being provided for performing class D amplification by allowing said first and second switching elements to perform a push-pull operation based on the respective drive signals supplied thereto,
wherein the class D amplifier further comprises:
a first resistor connected between said first switching element and said power supply;
a second resistor connected between said second switching element and said power supply;
a first current mirror circuit that receives a falling voltage generated at both ends of said first resistor and generates an electric current corresponding to said falling voltage; and
a second current mirror circuit that receives a falling voltage generated at both ends of said second resistor and generates an electric current corresponding to said falling voltage,
wherein said first bias voltage level shift means has first differential amplification means that calculates a differential signal between said first input signal and a predetermined voltage, and first bias means that generates a level-shifted drive signal to be supplied to said first switching element by pulling up said differential signal towards the power supply voltage of the first switching element,
wherein said second bias voltage level shift means has second differential amplification means that calculates a differential signal between said second input signal and a predetermined voltage, and second bias means that generates a level-shifted drive signal to be supplied to said second switching element by pulling down said differential signal towards the power supply voltage of the second switching element.

* * * * *